US012272561B2

(12) United States Patent
Lin et al.

(10) Patent No.: US 12,272,561 B2
(45) Date of Patent: *Apr. 8, 2025

(54) METHOD FOR MANUFACTURING SEMICONDUCTOR DEVICE

(71) Applicant: NANYA TECHNOLOGY CORPORATION, New Taipei (TW)

(72) Inventors: Li-Han Lin, Taoyuan (TW); Jr-Chiuan Wang, New Taipei (TW); Szu-Yu Hou, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 456 days.

This patent is subject to a terminal disclaimer.

(21) Appl. No.: 17/829,699

(22) Filed: Jun. 1, 2022

(65) Prior Publication Data

US 2023/0395388 A1 Dec. 7, 2023

(51) Int. Cl.
H01L 21/311 (2006.01)
H01L 21/768 (2006.01)
H10B 12/00 (2023.01)

(52) U.S. Cl.
CPC ... *H01L 21/31111* (2013.01); *H01L 21/31144* (2013.01); *H01L 21/76825* (2013.01); *H01L 21/76831* (2013.01); *H01L 21/76832* (2013.01); *H10B 12/482* (2023.02); *H10B 12/485* (2023.02); *H01L 21/76816* (2013.01)

(58) Field of Classification Search
None
See application file for complete search history.

(56) References Cited

U.S. PATENT DOCUMENTS 10,170,362 B2 * 1/2019 Chang ............... H01L 21/76224
2014/0264682 A1 9/2014 Chuang et al.
2019/0273042 A1 9/2019 Cheng et al.
(Continued)

FOREIGN PATENT DOCUMENTS

TW 200635032 A 10/2006
TW 202038416 A 10/2020

OTHER PUBLICATIONS

Office Action mailed Jun. 16, 2023 issued in corresponding Taiwan Application No. 111143914.

Primary Examiner — Sarah K Salerno
(74) Attorney, Agent, or Firm — Muncy, Geissler, Olds & Lowe, P.C.

(57) ABSTRACT

A method for manufacturing a semiconductor structure is provided. First, a first insulating layer is formed over a substrate, and a second insulating layer having an opening is formed over the first insulating layer. A conductive line structure is formed in the opening of the second insulating layer, thereby forming a contact void between the second insulating layer and the conductive line structure. A plasma oxide layer is conformally formed over the conductive line structure, the first insulating layer, and the contact void. A nitride capping layer is formed over the plasma oxide layer to fill the contact void. Then, nitrogen ions are introduced into a surface of the nitride capping layer surrounding the conductive line structure. An etching back process is performed to remove a portion of the nitride capping layer, thereby forming a refilled contact void between the first insulating layer and the conductive line structure.

11 Claims, 19 Drawing Sheets

(56) References Cited

U.S. PATENT DOCUMENTS

| | | |
|---|---|---|
| 2020/0373331 A1 | 11/2020 | Kim et al. |
| 2022/0028780 A1* | 1/2022 | Huang ................ H01L 23/5226 |
| 2022/0123210 A1* | 4/2022 | Banno ................ H10N 70/8416 |
| 2023/0369104 A1* | 11/2023 | Lin .................... H01L 21/76831 |
| 2023/0369105 A1* | 11/2023 | Lin .................... H01L 21/76832 |

* cited by examiner

METHOD FOR MANUFACTURING SEMICONDUCTOR DEVICE

TECHNICAL FIELD

The present disclosure relates to a method for manufacturing a semiconductor device, and more particularly, to a method for manufacturing a semiconductor device having less or without undercut etching.

DISCUSSION OF THE BACKGROUND

Semiconductor devices are widely used in electronics industries. Semiconductor devices may have relatively small sizes, multi-functional characteristics, and/or relatively low manufacture costs. The development of semiconductor device technology progresses continuously and the designs in the semiconductor devices of the new generation become smaller and more complicated than those of the former generation.

Wet etching process is commonly used in manufacturing semiconductor devices. The wet etching process normally uses acidic solutions to etch, but the etching techniques have the disadvantages that the chemical reaction is not directional, and the surrounding materials are damaged, so that the process is difficult to control and an undesired undercut may be formed. As the size of the device becomes smaller, influence of defects induced by undesired undercuts generated during the manufacturing methods may become more serious, and the manufacturing yield may be affected accordingly.

This Discussion of the Background section is provided for background information only. The statements in this Discussion of the Background are not an admission that the subject matter disclosed in this section constitutes prior art with respect to the present disclosure, and no part of this Discussion of the Background may be used as an admission that any part of this application constitutes prior art with respect to the present disclosure.

SUMMARY

One aspect of the present disclosure provides a method for manufacturing a semiconductor structure, comprising forming a first insulating layer over a substrate; forming a second insulating layer having an opening over the first insulating layer; forming a conductive line structure in the opening of the second insulating layer, thereby forming a contact void between the second insulating layer and the conductive line structure; conformally forming a plasma oxide layer over the conductive line structure, the second insulating layer, and the contact void; forming a nitride capping layer over the plasma oxide layer, the nitride capping layer filling the contact void; introducing nitrogen ions into a surface of the nitride capping layer surrounding the conductive line structure; and performing an etching back process to remove a portion of the nitride capping layer, thereby forming a refilled contact void between the second insulating layer and the conductive line structure.

Another aspect of the present disclosure provides a method for manufacturing a semiconductor device, comprising forming a first insulating layer having a bit line contact over a substrate; forming a second insulating layer having a bit line opening over the first insulating layer; forming a bit line structure in the bit line opening, the bit line structure being electrically connecting to the bit line contact, and a contact void being formed surrounding the bit line structure and exposing a portion of the bit line contact; conformally forming a nitride spacer layer over the bit line structure, the second insulating layer, and the contact void; conformally forming a plasma oxide layer over the nitride spacer layer; forming a nitride capping layer over the plasma oxide layer, the nitride capping layer filling the contact void; introducing nitrogen ions into a surface of the nitride capping layer surrounding the bit line structure; and performing an etching back process to remove a portion of the nitride capping layer, thereby forming a refilled contact void between the second insulating layer and the bit line structure.

In some embodiments, the nitrogen ions are introduced into the surface of the nitride capping layer in a uniform concentration profile.

In some embodiments, the nitrogen ions are introduced into the surface of the nitride capping layer in a non-uniform concentration profile.

In some embodiments, the method of introducing nitrogen ions into a surface of the nitride capping layer is performed by an ion implantation process.

In some embodiments, the method of introducing nitrogen ions into a surface of the nitride capping layer comprises forming a patterned mask layer over the nitride capping layer, the patterned mask layer having a hole corresponding the contact void; doping nitrogen ions into the surface of the nitride capping layer through the hole of the patterned mask layer; and removing the patterned mask layer.

In some embodiments, the first insulating layer has a conductive contact underneath the opening in the second insulating layer.

In some embodiments, the method of forming a second insulating layer having an opening comprises forming a second insulating layer over the first insulating layer; and forming an opening in the second insulating layer to expose a top surface of the conductive contact in the first insulating layer, wherein a width of the opening is greater than a width of the top surface of the conductive contact.

In some embodiments, a top surface of the conductive contact is fully exposed by the opening in the second insulating layer.

In some embodiments, a top surface of the conductive contact is partially exposed by the contact void.

In some embodiments, the contact void surrounds the conductive line structure.

In some embodiments, prior to forming the plasma oxide layer, the method further comprises conformally forming a nitride spacer layer over the conductive line structure, the first insulating layer, and the contact void.

In some embodiments, the plasma oxide layer is conformally disposed on the nitride spacer layer.

In some embodiments, the etching back process is performed by using a wet etchant comprising phosphorus acid.

In some embodiments, the etching back process is performed by using the plasma oxide layer as an etch stop layer.

In some embodiments, a top surface of the refilled contact void is a flat surface.

In the manufacturing methods of the semiconductor structure or semiconductor device, a nitrogen ion implantation process is performed to result in a different density profile in the nitride capping layer and increase the density of the nitride capping layer surrounding the conductive line structure. The nitrogen ions are implanted into a portion of the nitride capping layer where an undercut may be occurred, so as to form a substantially flat surface after the etching back process. By using the nitrogen ion implantation process prior to the etching back process, defects induced by undesired undercut can be avoided or reduced, and the manufacturing yield may be increased accordingly. Therefore, the device performance can be enhanced.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
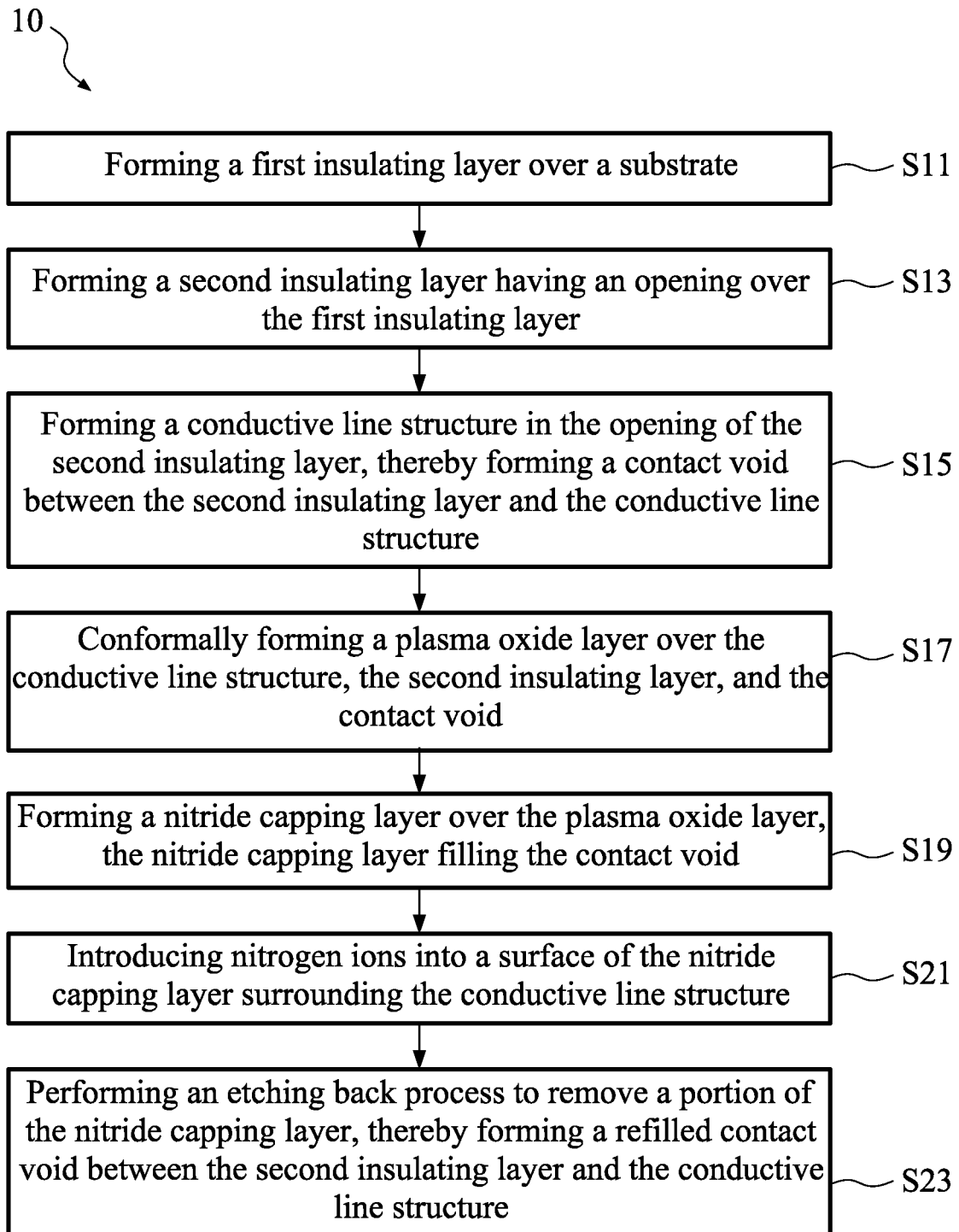
FIG. 1 is a flow diagram illustrating a method for manufacturing a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that the terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It will be understood that when an element is referred to as being formed "on," "over," "below," or "underneath," another element, it can be directly or indirectly, formed on or under the given element by growth, deposition, etch, attach, connect, or couple.

It will be understood that, although the terms "first," "second," etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially flat," or "substantially vertical," may be exactly the same, equal, or planar, or may be the same, equal, or planar within acceptable variations that may occur, for example, due to manufacturing processes.

FIG. 1 is flow diagram illustrating a method 10 for manufacturing a semiconductor structure 20 in accordance with some embodiments of the present disclosure. The method 10 can avoid or significantly reduce particle-induced defects. The method 10 may be performed as operations. It may be noted that the method 10 may include the same, more, or fewer operations. It may be noted that the method 10 may be performed by one or more pieces of semiconductor fabrication equipment or fabrication tools. In some embodiments, the method 10 includes operations (steps) S11, S13, S15, S17, S19, S21, and S23. The steps S1 to S23 of FIG. 1 are elaborated in connection with following figures.

Figure 2:
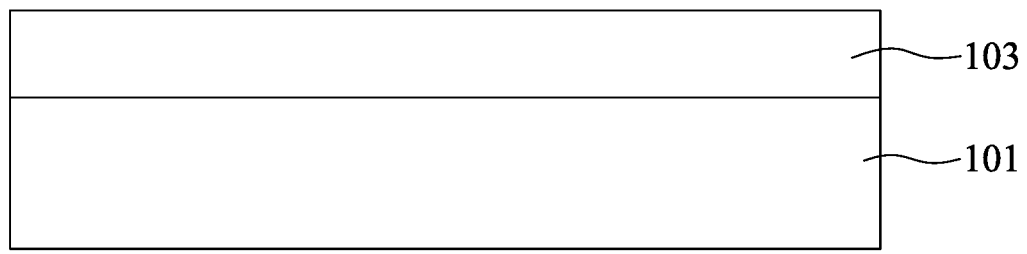
FIG. 2 to FIG. 9 are schematic cross-sectional views illustrating one or more stages of a method for manufacturing a semiconductor structure in accordance with some embodiments of the present disclosure.

FIGS. 2 to 9 are schematic cross-sectional views illustrating one or more stages of a method for manufacturing a semiconductor structure 20 in accordance with some embodiments of the present disclosure. With reference to FIGS. 1 and 2, at step S11, a substrate 101 is provided, and a first insulating layer 103 is formed over the substrate 101. The substrate 101 may be formed of a semiconductor material, for example, silicon, doped silicon, silicon germanium, silicon on insulator, silicon on sapphire, or silicon carbide, but is not limited thereto. The first insulating layer 103 may be formed of silicon nitride, silicon oxide, silicon oxynitride, or a combination thereof but is not limited thereto.

Figure 3:
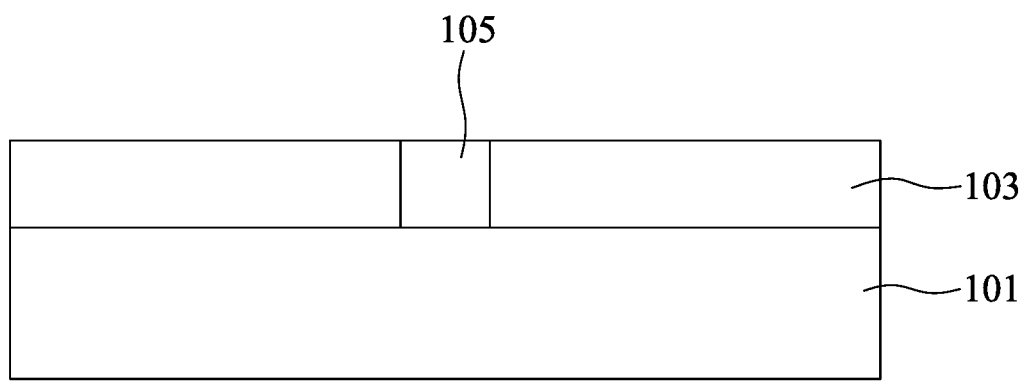
Figure 4:
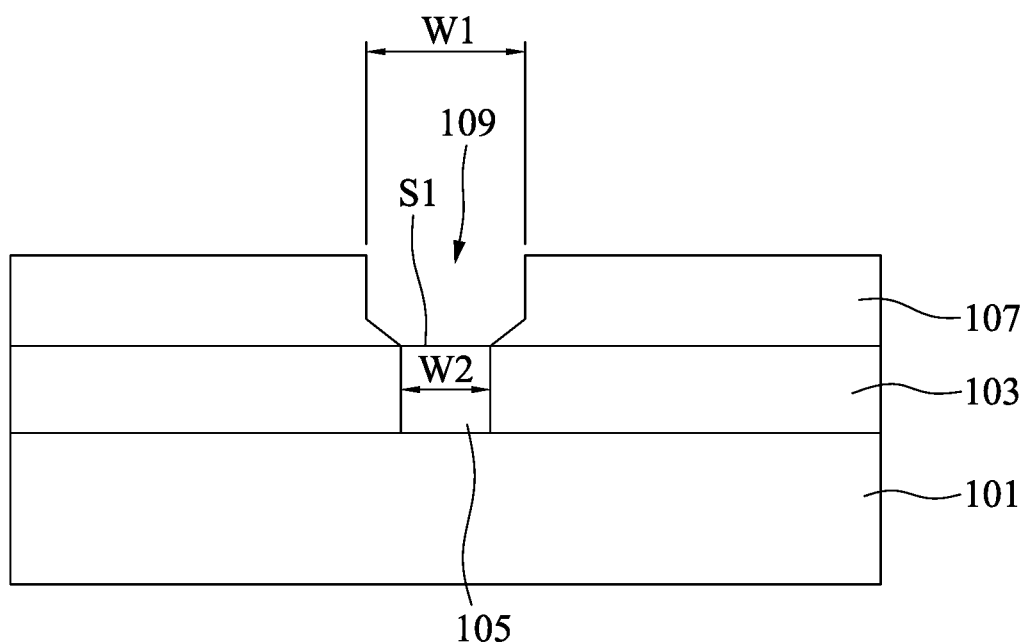

With reference to FIGS. 1, 3 and 4, at step S13, a second insulating layer 107 having an opening 109 is formed over the first insulating layer. Referring to FIG. 3, a conductive contact 105 may be formed in the first insulating layer 103. A plurality of conductive contacts (not shown) may be formed, but only one conductive contact 105 is shown in FIG. 3. The method may be performed by using a photolithography process to pattern the first insulating layer 103 to define the position of the conductive contact 105. An etch process, such as an anisotropic dry etch process, may be performed after the photolithography process to form a contact hole (not shown) in the first insulating layer 103. After the etch process, a conductive material layer (not shown), for example, aluminum, copper, tungsten, cobalt, or other suitable metal or metal alloy is deposited, by a deposition process such as chemical vapor deposition, physical vapor deposition, sputtering, or the like, in the contact hole for forming the conductive contact 105. A planarization process, such as chemical mechanical polishing, may be performed after the deposition process to remove excess deposited material and provide a substantially flat surface for subsequent processing steps.

Referring to FIG. 4, the first insulating layer 103 may have a conductive contact 105 underneath the opening 109 in the second insulating layer 107. The second insulating layer 107 having the opening 109 is formed over the first insulating layer 103, so that a top surface S1 of the conductive contact 105 is exposed through the opening 109. A top surface S1 of the conductive contact 105 is fully or partially exposed through the opening 109. A plurality of openings (not shown) may be formed over a corresponding conductive contact, but only one opening 109 is shown in FIG. 4. Referring to FIG. 4, the method is performed by forming a second insulating layer 107 on the first insulating layer 103. The second insulating layer 107 may be formed of the same material as the material of the first insulating layer 103, but is not limited thereto. A photolithography process may be used to pattern the second insulating layer 107 to define the position of the opening 109. An etch process, such as an anisotropic dry etch process, may be performed after the photolithography process to form the opening 109 in the second insulating layer 107. The opening 109 may be referred to as a bit line opening. The opening 109 has a width W1 greater than or substantially the same as a width W2 of the conductive contact 105, so that a top surface S1 of the conductive contact 105 is fully exposed by the opening 109. The width W1 can be a width at any position of the opening 109. The width W1 can be the largest or smallest width of the opening 109. The width W2 can be a width at any position of the conductive contact 105. The width W2 can be the largest or smallest width of the conductive contact 105. In some embodiments, the smallest width of the opening 109 is greater than the width of the top surface S1 of the conductive contact 105. The opening 109 is broader enough to facilitate forming a conductive line structure therein at the subsequent step. The opening 109 may have a cross-sectional shape, such as a rectangular, a square, a wide upper and narrower lower shape, but is not limited thereto. The opening 109 may also have a hole-like or well-like shape. The opening 109 may have an inclined sidewall, a substantially vertical sidewall, but is not limited thereto.

Figure 5:
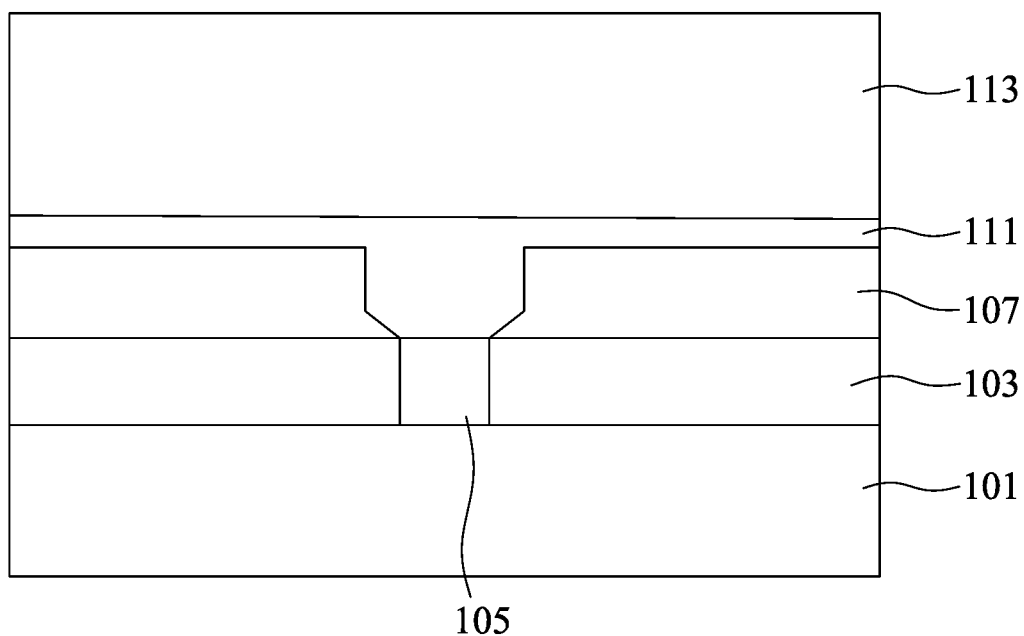
Figure 6:
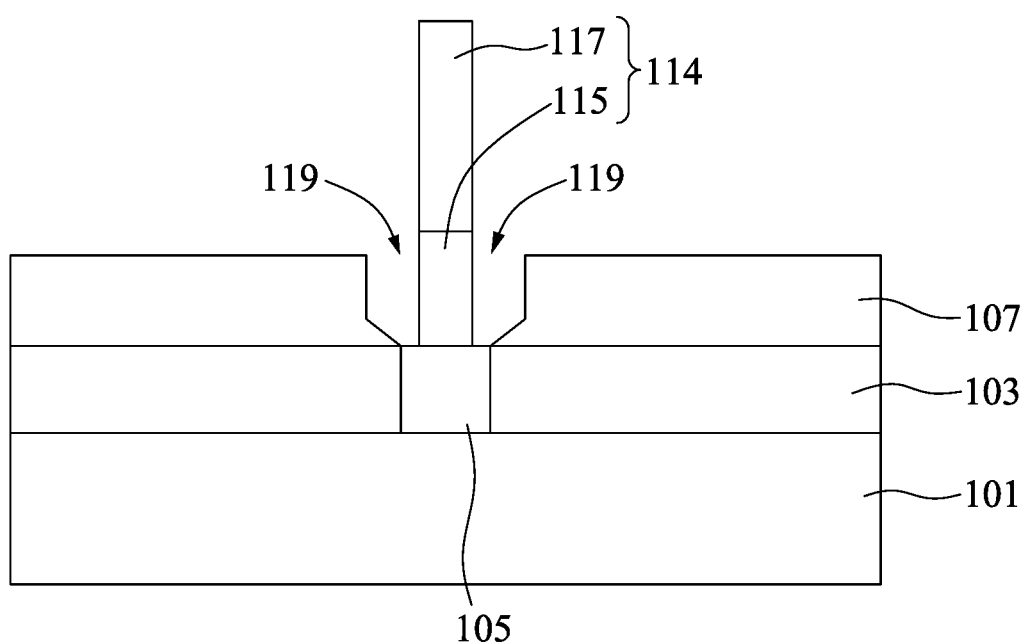

With reference to FIGS. 1, 5 and 6, at step S15, a conductive line structure 114 is formed in the opening 109 of the second insulating layer 107, wherein the conductive line structure 114 covers a portion of the top surface S1 of the conductive contact 105 thereby forming a contact void 119 between the second insulating layer 107 and the conductive line structure 114. The conductive line structure 114 may be a single layer or a stack. The conductive line structure 114 comprising two conductive material layers is shown in FIGS. 5 and 6. Referring to FIG. 5, the method may be performed to form a lower conductive material layer 111 in the opening 109 and on the second insulating layer 109 through a deposition process, and forming an upper conductive material layer 113 on the lower conductive material layer 111. The lower conductive material layer 111 may be a single layer including doped polysilicon, a metal, a metal silicide or a metal compound, or it may be a multi-layer including any combination of the above materials, but is not limited thereto. The upper conductive material layer 113 may include a metal or a metal compound, but is not limited thereto. A barrier layer (not shown) may be formed between the lower conductive material layer 111 and the upper conductive material layer 113. The barrier layer contains titanium nitride or titanium tungsten nitride, but is not limited thereto.

Referring to FIG. 6, the method may be performed to form a conductive line structure 114 having a lower conductive line structure 115 and an upper conductive line structure 117 by successively patterning the upper conductive material layer 113 and the lower conductive material layer 111 through an etch process. An etch process is performed by using a patterned mask layer (not shown) as a mask to pattern the upper conductive material layer 113 and the lower conductive material layer 111. Thus, the two patterned conductive material layer together form the conductive line structure 114. The lower conductive line structure 115 and the upper conductive line structure 117 may have a line shape extending horizontally in a one-dimensional way, or a plug-like or pillar-like shape. The conductive line structure 114 has a width narrower than the conductive contact 105, so that a portion of the top surface S1 of the conductive contact 105 is exposed. After forming the conductive line structure 114, a contact void 119 is formed between the second insulating layer 107 and the conductive line structure 114 and surrounding the conductive line structure 114. The top surface S1 of the conductive contact 105 is also partially exposed through the contact void 119. To avoid the contact void 119 from affecting the electricity or properties of the semiconductor structure, the contact void 119 has to be refilled at the subsequent steps.

Figure 7:
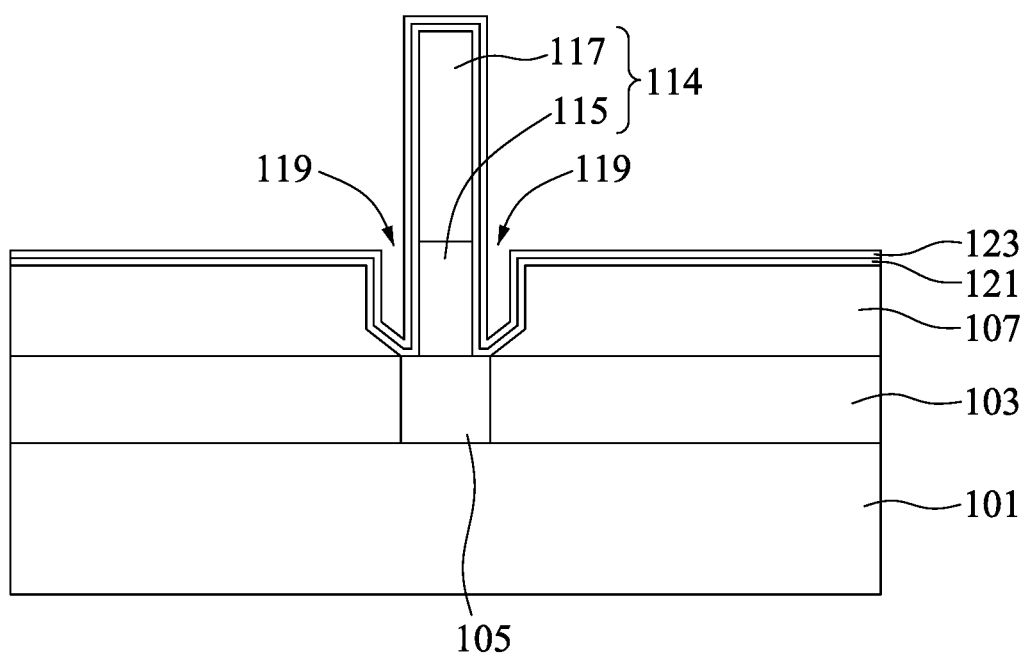

With reference to FIGS. 1 and 7, at step S17, a plasma oxide layer 123 is conformally formed over the conductive line structure 114, the second insulating layer 107, and the contact void 119. The plasma oxide layer 123 covers exposed surfaces of the conductive line structure 114, the second insulating layer 107, and the contact void 119. Prior to forming the plasma oxide layer 123, a nitride spacer layer 121 may be conformally deposited over the conductive line structure 114, the second insulating layer 107, and the contact void 119, and the plasma oxide layer 123 is then conformally disposed on the nitride spacer layer 121. The nitride spacer layer 121 may be formed on the sidewalls of the conductive line structure 114. The nitride spacer layer 121 may be formed of silicon nitride. The plasma oxide layer 123 may comprise silicon oxide, silicone dioxide, silicon oxyfluoride, or silicon oxynitride, but is not limited thereto. The plasma oxide layer 123 may be formed by plasma enhanced chemical vapor deposition, high density plasma chemical vapor deposition, or thermal plasma chemical vapor deposition, but is not limited thereto.

Figure 8:
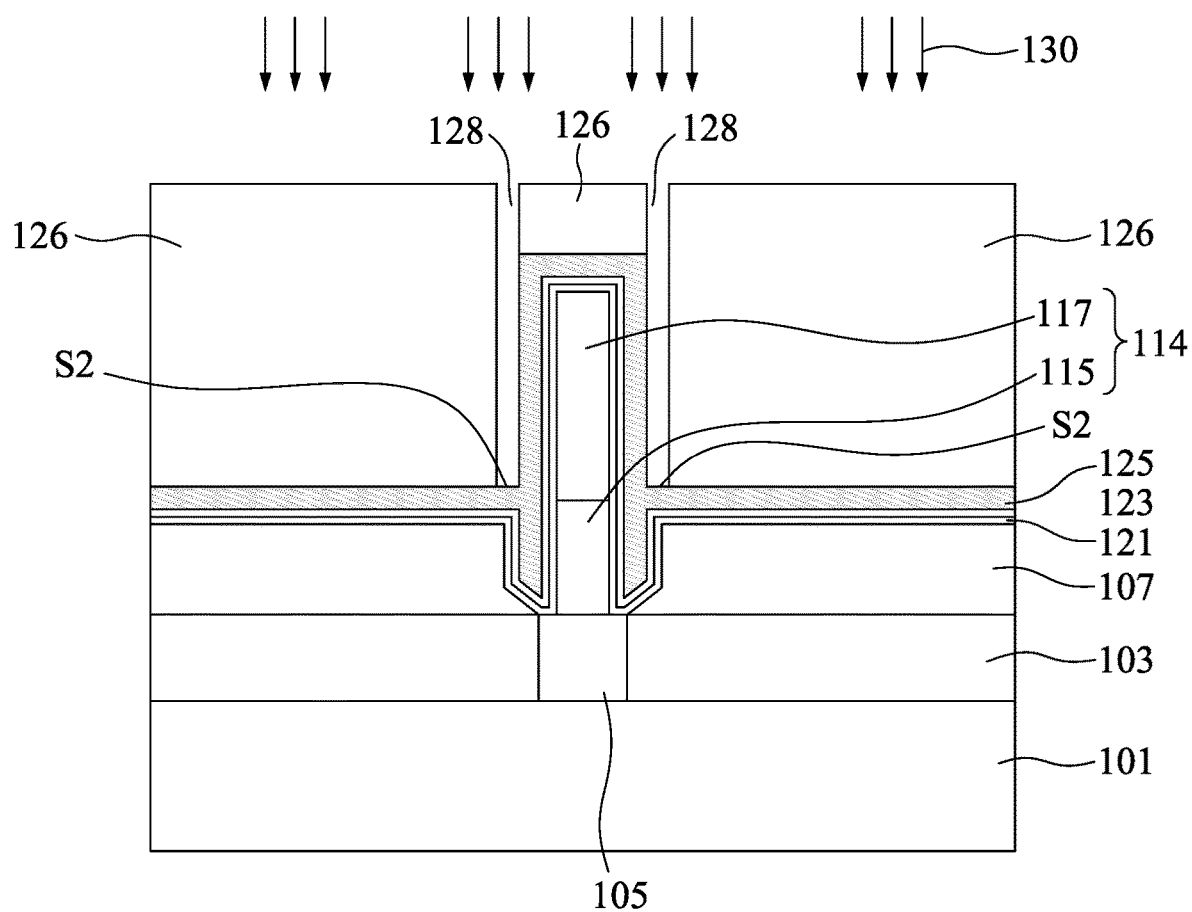

With reference to FIGS. 1 and 8, at steps S19 and S21, a nitride capping layer 125 is formed over the plasma oxide layer 123, the nitride capping layer 125 fills into the contact void 119, and then nitrogen ions are introduced into a surface S2 of the nitride capping layer 125 surrounding the conductive line structure 114. The contact void 119 has to be filled with the nitride capping layer 125 so as to avoid breakthrough that may be occurred. The nitride capping layer 125 is formed in the contact void 119 and on the plasma oxide layer 123. The nitride capping layer 125 is thick enough so that the contact void 119 is fully refilled. The nitride capping layer 125 is formed of silicon nitride.

Then, a patterned mask layer 126 is formed over the nitride capping layer 125 and the conductive line structure 114. The patterned mask layer 126 has a hole 128 corresponding to the position of the contact void 119. A top surface S2 of the nitride capping layer 125 surrounding the conductive line structure 114 is exposed by the hole 128. A nitrogen ion implantation process 130 is performed to introduce nitrogen ions into the exposed surface S2 of the nitride capping layer 125 through the hole 128. The nitrogen ions are implanted into a bottom portion of the nitride capping layer 125. The dosage and energy of the nitrogen ion implantation process 130 are not limited and can be adjusted depending on the needs. The surface S2 of the nitride capping layer 125 that is doped with the nitrogen ions is denser than the other parts of the nitride capping layer 125. The density of the nitrogen ion-doped nitride capping layer is larger than that of the non-doped nitride capping layer. The density of the nitrogen ion-doped nitride capping layer is about twice, about three times, or more than that of the non-doped nitride capping layer. The nitrogen ions may be introduced into the surface S2 of the nitride capping layer 125 in a uniform or non-uniform concentration profile. The patterned mask layer 126 is then removed.

Figure 9:
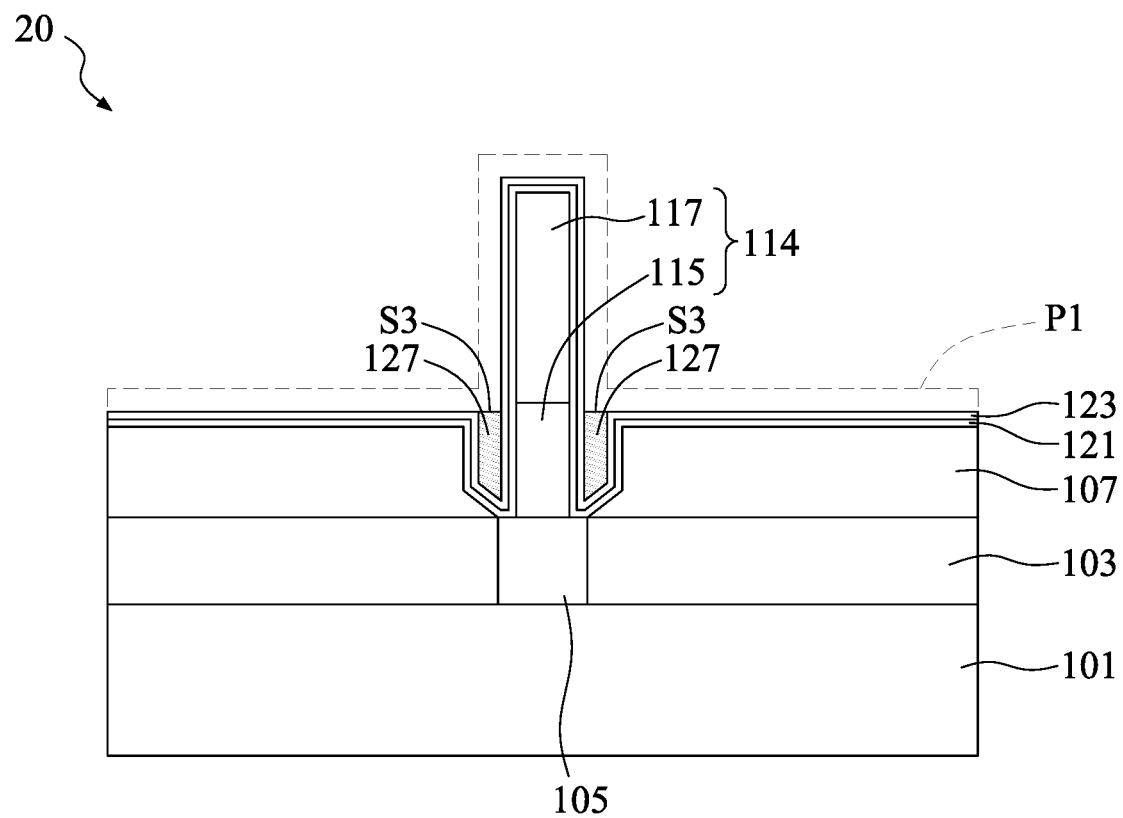

With reference to FIGS. 1 and 9, at step S23, an etching back process is performed to remove a portion P1 of the nitride capping layer 125, thereby forming a refilled contact void 127 between the second insulating layer 107 and the conductive line structure 114. The nitride capping layer 125 is completely removed expect for that in the contact void 119. The etching back process is performed to remove the nitride capping layer 125 above the contact void 119. The etching back process is performed to remove the nitride capping layer 125 until the plasma oxide layer 123 is exposed and a refilled contact void 127 is formed. The plasma oxide layer 123 is used as an etch stop layer. In the etching back process, the corner of the nitride capping layer 125 is the slowest position to etch because of the surface area, so the etching time on the bottom of the nitride capping layer 125 has to increase; however, this may result in damaging the nitride capping layer 125 surrounding the conductive line structure 114 due to long-term etching and thus forming an undesired undercut (not shown). By performing the nitrogen ion implantation process prior to the etching back process, the density of the surface S2 of the nitride capping layer 125 surrounding the conductive line structure 114 can be increased. Thus, a surface S3 of the refilled contact void 127 can be a substantially flat surface, and an undesired undercut is not formed. The etching back process is performed by using a wet etchant comprising phosphorus acid. The etching back process is an isotropic removal process performed with hot phosphoric acid etching in an immersion bath at a temperature of about exceeding about 160° C., such as about 165° C.

Referring to FIG. 9, after performing the nitrogen ion implantation process and the etching back process, the refilled contact void 127 has a flat surface. The refilled contact void 127 does not have an undercut surface. By using the nitrogen ion implantation process to modify the density of the nitride capping layer 125, defects inducing from conventional undesired undercut can be avoided from generating at the subsequent procedure. Moreover, the use of the nitrogen ions as dopants does not affect the electricity and properties of the semiconductor structure. Since defects induced by the undesired undercut can be effectively avoided or reduced, the manufacturing yield may be increased accordingly.

Figure 10:
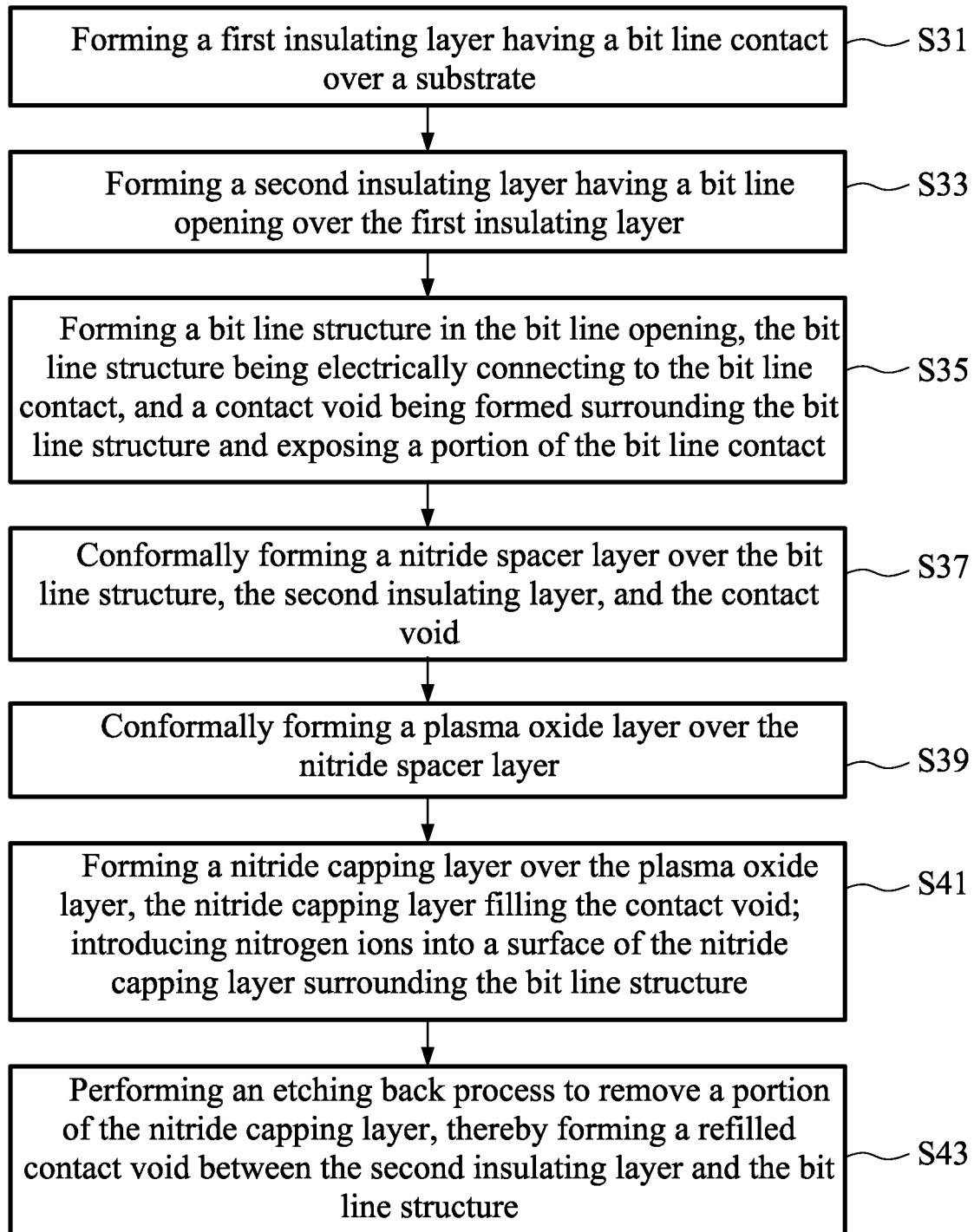
FIG. 10 is a flow diagram illustrating a method for manufacturing a semiconductor device in accordance with some embodiments of the present disclosure.

FIG. 10 is flow diagram illustrating a method 100 for manufacturing a semiconductor device 200 in accordance with some embodiments of the present disclosure. The method 100 can avoid or significantly reduce particle-induced defects. The method 100 may be performed as operations. It may be noted that the method 100 may include the same, more, or fewer operations. It may be noted that the method 100 may be performed by one or more pieces of semiconductor fabrication equipment or fabrication tools. In some embodiments, the method 100 includes operations (steps) S31, S33, S35, S37, S39, S41, and S43. The steps S31 to S43 of FIG. 10 are elaborated in connection with following figures.

Figure 11:
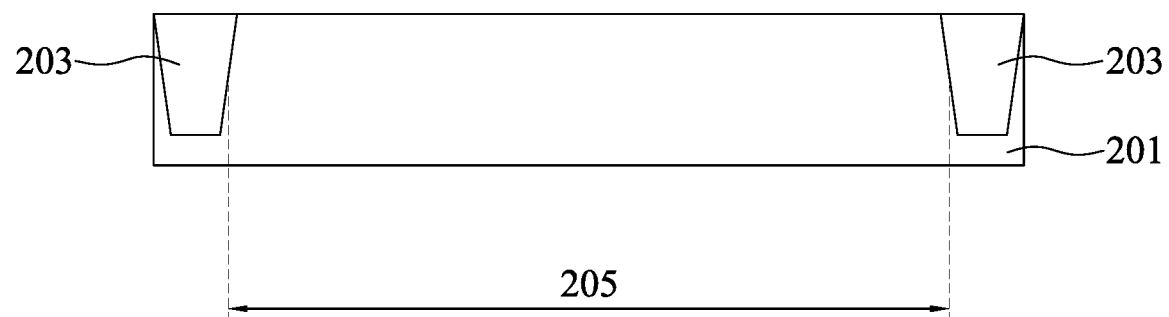
FIG. 11 to FIG. 19 are schematic cross-sectional views illustrating one or more stages of a method for manufacturing a semiconductor device in accordance with some embodiments of the present disclosure.

FIGS. 11 to 19 are schematic cross-sectional views illustrating one or more stages of a method for manufacturing a semiconductor device 200 in accordance with some embodiments of the present disclosure. In some embodiments, some of FIGS. 11 to 19 correspond to FIGS. 2 to 9, and in this figures, similar descriptions regarding the same components or elements are omitted. With reference to FIGS. 10 and 11, an isolation member 203 defining an active region 205 is formed in a substrate 201. While two isolation members 203 and one active region 205 are illustrated in the figures, it will be appreciated that the substrate 201 may include any suitable number of isolation members 203 and active regions 205. The other components or elements may include any suitable number in the semiconductor device. The plurality of isolation members 203 are separated from each other in a cross-sectional view and define a plurality of active regions 205. The forming of the isolation members 203 may be implemented by performing a shallow trench isolation (STI) process. The plurality of isolation members 203 may be formed of, for example, an insulating material such as silicon oxide, silicon nitride, silicon oxynitride, silicon nitride oxide, or fluoride-doped silicate, but is not limited thereto.

Figure 12:
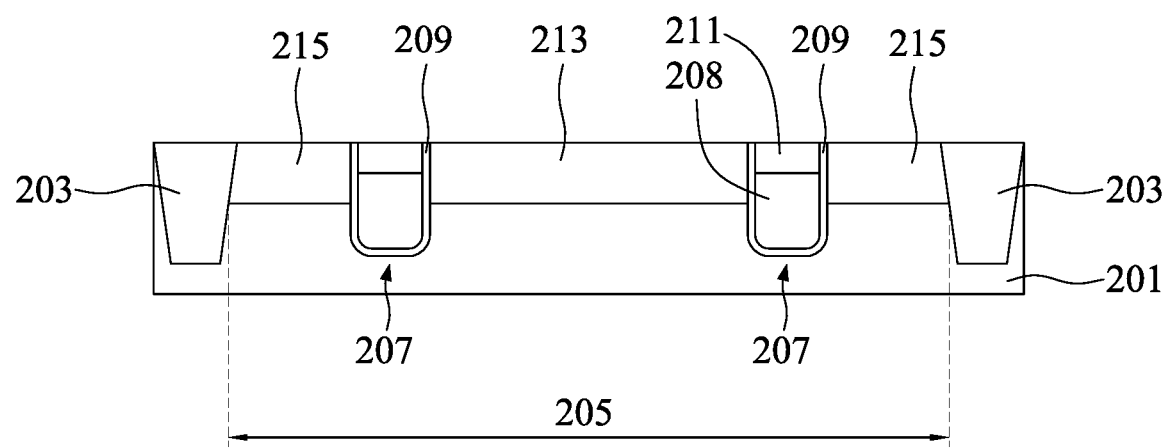

With reference to FIGS. 10 and 12, a word line 207 may be formed in the substrate 201. While two word lines 207 are illustrated in the figures, it will be appreciated that the substrate 201 may include any suitable number of word lines 207. In some embodiments, each one of the plurality of word lines 207 may include a bottom layer 208 and a top layer 211. The bottom layers 208 may be formed of, for example, silicon oxide, silicon oxynitride, silicon nitride oxide, or silicon nitride, but is not limited thereto. The top layer 211 may be formed of for example, doped polysilicon, metal material, metal silicide, but is not limited thereto. In some embodiments, a barrier layer 209 may be formed between the word line 207 and the substrate 201. Then, a plurality of doped regions may be formed in the active regions 205 of the substrate 201. The plurality of the doped regions may include a first doped region 213 and a second doped regions 215. The first doped region 213 is disposed between two adjacent word lines 207. The second doped regions 215 are respectively disposed between the plurality of isolation members 203 and the plurality of word lines 207. The first doped region 213 and the second doped regions 215 are respectively doped with a dopant such as phosphorus, arsenic, or antimony.

Figure 13:
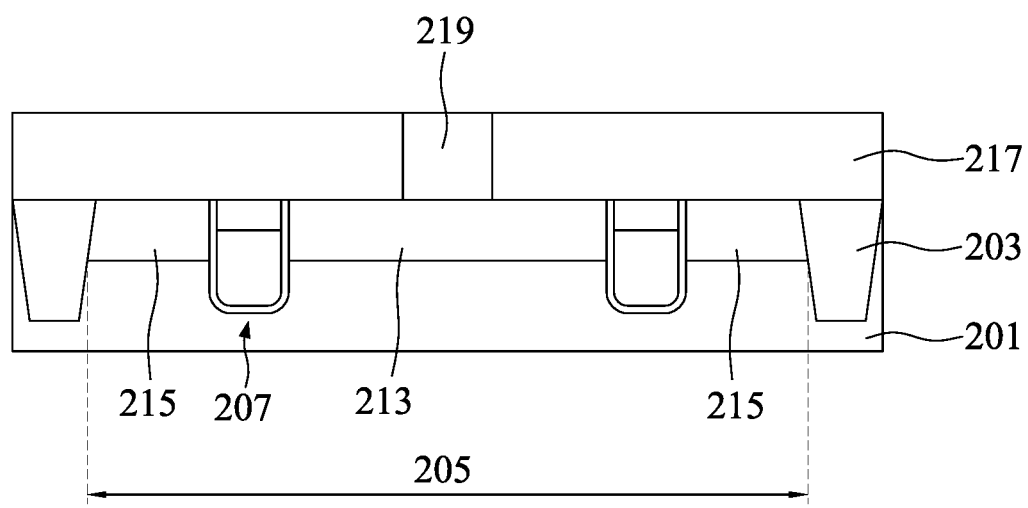

With reference to FIGS. 10 and 13, at step S31, a first insulating layer 217 is formed over the substrate 201, and a bit line contact 219 is formed in the first insulating layer 103. The bit line contact 219 is disposed over the first active region 213 of the substrate 201. The bit line contact 219 is disposed on the first doped region 213 and is electrically connected to the first doped region 213.

Figure 14:
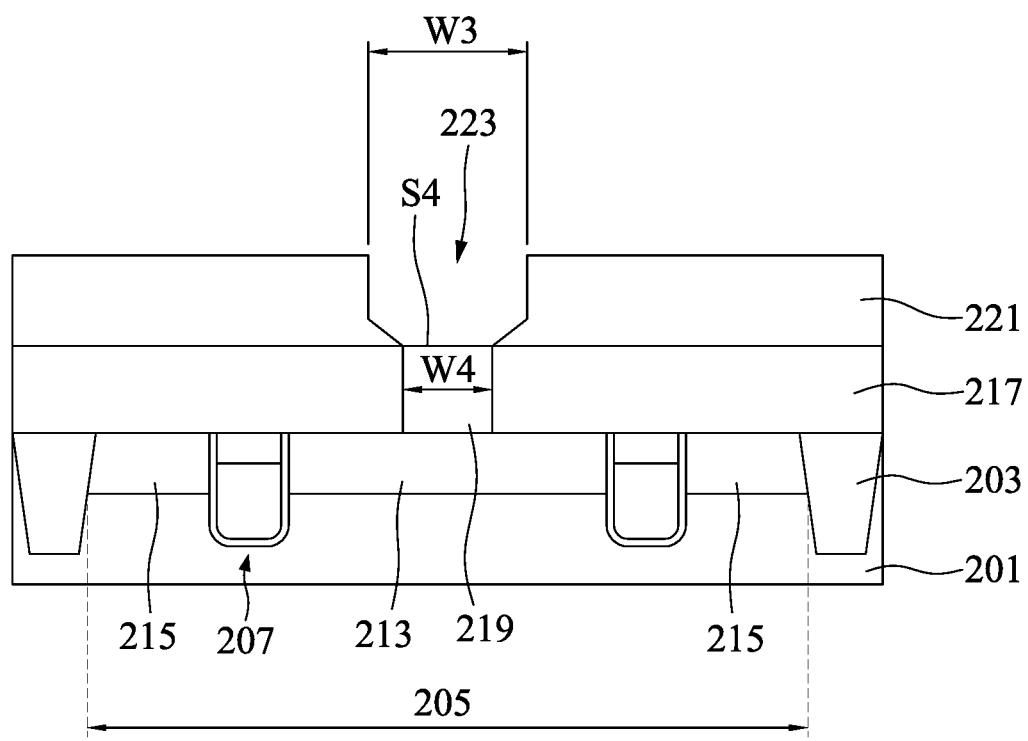

With reference to FIGS. 10 and 14, at step S33, a second insulating layer 221 having a bit line opening 223 is formed over the first insulating layer 217, so that a top surface S4 of the bit line contact 219 is exposed through the bit line opening 223. Referring to FIG. 14, the method is performed by forming a second insulating layer 221 on the first insulating layer 217. A photolithography process may be used to pattern the second insulating layer 221 to define the position of the bit line opening 223. An etch process, such as an anisotropic dry etch process, may be performed after the photolithography process to form the bit line opening 223 in the second insulating layer 221. The bit line opening 223 may be referred to as a bit line opening. The bit line opening 223 has a width W3 greater than or substantially the same as a width W4 of the conductive contact 219, so that a top surface S4 of the bit line contact 219 is fully exposed by the bit line opening 223. The width W3 can be a width at any position of the bit line opening 223. The width W3 can be the largest or smallest width of the bit line opening 223. The width W4 can be a width at any position of the bit line contact 219. The width W4 can be the largest or smallest width of the bit line contact 219. In some embodiments, a smallest width of the bit line opening 223 is greater than a width of the top surface S4 of the bit line contact 219. The bit line opening 223 is broader enough to facilitate forming a conductive line structure therein at the subsequent step. The bit line opening 223 may have a cross-sectional shape, such as a rectangular, a square, a wide upper and narrower lower shape, but is not limited thereto. A width of the bottom surface of the bit line opening 223 is substantially to or greater than a width of the top surface S4 of the bit line contact 219. The bit line opening 223 may also have a hole-like or well-like shape. The bit line opening 223 may have an inclined sidewall, a substantially vertical sidewall, but is not limited thereto.

Figure 15:
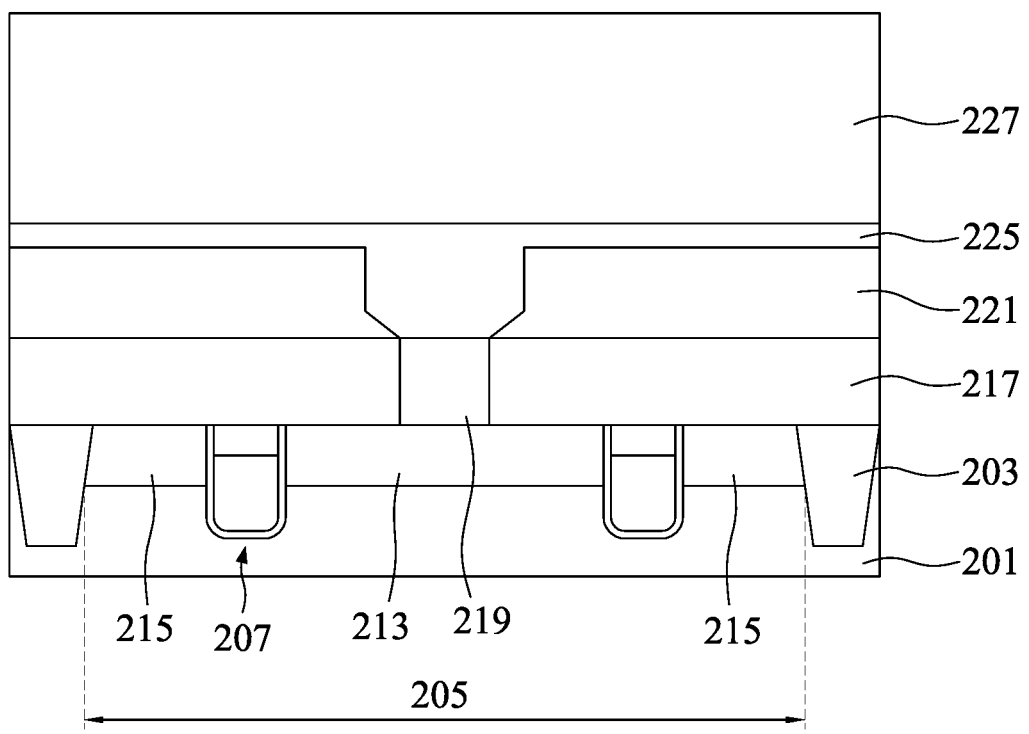
Figure 16:
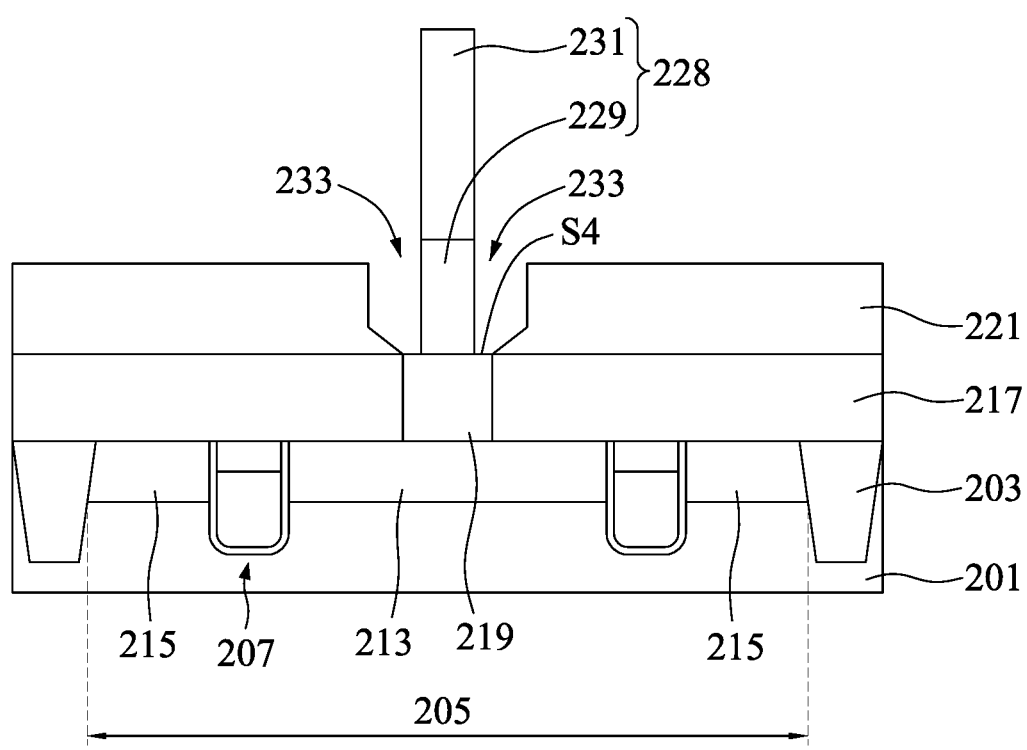

With reference to FIGS. 10, 15 and 16, at step S35, a bit line structure 228 is formed in the bit line opening 223 of the second insulating layer 221, wherein the bit line structure 228 covers a portion of the top surface S4 of the bit line contact 219 thereby forming a contact void 233 between the second insulating layer 221 and the bit line structure 228. The bit line structure 228 may be a single layer or a stack. The bit line structure 228 comprising two conductive material layers is shown in FIGS. 15 and 16. Referring to FIG. 15, the method may be performed to form a lower conductive material layer 225 in the bit line opening 223 and on the second insulating layer 221 through a deposition process, and forming an upper conductive material layer 227 on the lower conductive material layer 225. The lower conductive material layer 225 may be a single layer including doped polysilicon, a metal, a metal silicide or a metal compound, or it may be a multi-layer including any combination of the above materials, but is not limited thereto. The upper conductive material layer 227 may include a metal or a metal compound, but is not limited thereto. A barrier layer (not shown) may be formed between the lower conductive material layer 225 and the upper conductive material layer 227. The barrier layer contains titanium nitride or titanium tungsten nitride, but is not limited thereto.

Referring to FIG. 16, the method may be performed to form a bit line structure 228 having a lower bit line structure 229 and an upper bit line structure 231 by successively patterning the upper conductive material layer 227 and the lower conductive material layer 225 through an etch process. An etch process is performed by using a patterned mask layer (not shown) as a mask to pattern the upper conductive material layer 227 and the lower conductive material layer 225. Thus, the two patterned conductive material layer together form the bit line structure 228. The lower bit line structure 229 and the upper bit line structure 231 may have a line shape extending horizontally in a one-dimensional way, or a plug-like or pillar-like shape. The bit line structure 228 may have a width narrower than the bit line contact 219, so that a portion of the top surface S4 of the bit line contact 219 is exposed. After forming the bit line structure 228, a contact void 233 is formed between the second insulating layer 221 and the bit line structure 228 and surrounding the bit line structure 228. The top surface S4 of the bit line contact 219 is also partially exposed through the contact void 233. To avoid the contact void 233 from affecting the electricity or properties of the semiconductor structure, the contact void 233 has to be refilled at the subsequent steps.

Figure 17:
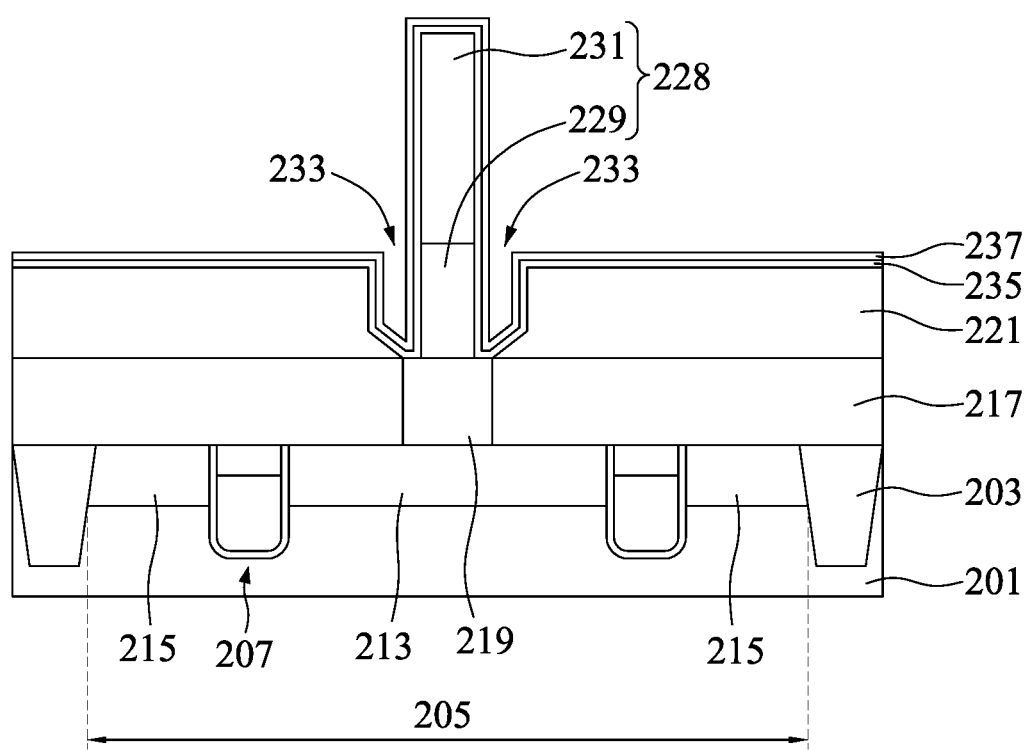

With reference to FIGS. 10 and 17, at steps S37 and S39, a nitride spacer layer 235 is conformally formed over the bit line structure 228, the second insulating layer 221 and the contact void 233, and a plasma oxide layer 237 is then conformally formed over the nitride spacer layer 235. The nitride spacer layer 235 may be formed on the sidewalls of the bit line structure 228. The nitride spacer layer 235 may be formed of silicon nitride. The plasma oxide layer 237 may comprise silicon oxide, silicone dioxide, silicon oxyfluoride, or silicon oxynitride, but is not limited thereto. The plasma oxide layer 237 may be formed by plasma enhanced chemical vapor deposition, high density plasma chemical vapor deposition, or thermal plasma chemical vapor deposition, but is not limited thereto.

Figure 18:
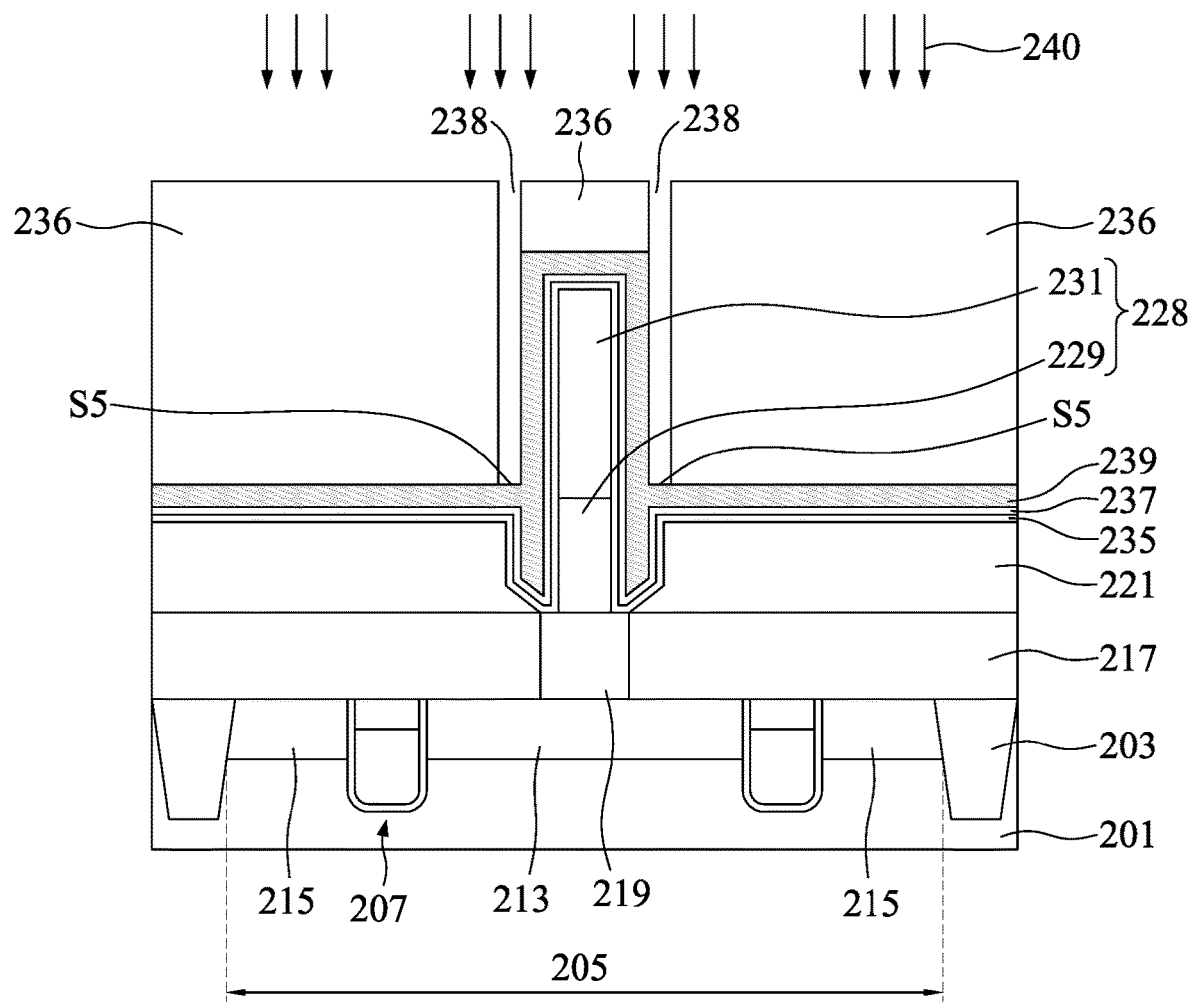

With reference to FIGS. 1 and 18, at steps S41 and S43, a nitride capping layer 239 is formed over the plasma oxide layer 237, the nitride capping layer 239 fills into the contact void 233, and then nitrogen ions are introduced into a surface S5 of the nitride capping layer 239 surrounding the bit line structure 228. The contact void 233 has to be filled with the nitride capping layer 239 so as to avoid breakthrough that may be occurred. The nitride capping layer 239 is formed in the contact void 233 and on the plasma oxide layer 237. The nitride capping layer 239 is thick enough so that the contact void 233 is fully refilled. The nitride capping layer 239 is formed of silicon nitride.

Then, a patterned mask layer 236 is formed over the nitride capping layer 239 and the bit line structure 228. The patterned mask layer 236 has a hole 238 corresponding to the position of the contact void 233. A top surface S5 of the nitride capping layer 239 surrounding the bit line structure 228 is exposed by the hole 238. A nitrogen ion implantation process 240 is performed to introduce nitrogen ions into the exposed surface S5 of the nitride capping layer 239 through the hole 238. The nitrogen ions are implanted into a bottom portion of the nitride capping layer 239. The dosage and energy of the nitrogen ion implantation process 240 are not limited and can be adjusted depending on the needs. The surface S5 of the nitride capping layer 239 that is doped with the nitrogen ions is denser than the other parts of the nitride capping layer 239. The density of the nitrogen ion-doped nitride capping layer is larger than that of the non-doped nitride capping layer. The density of the nitrogen ion-doped nitride capping layer is about twice, about three times, or more than that of the non-doped nitride capping layer. The nitrogen ions may be introduced into the surface S5 of the nitride capping layer 239 in a uniform or non-uniform concentration profile. The patterned mask layer 236 is then removed.

Figure 19:
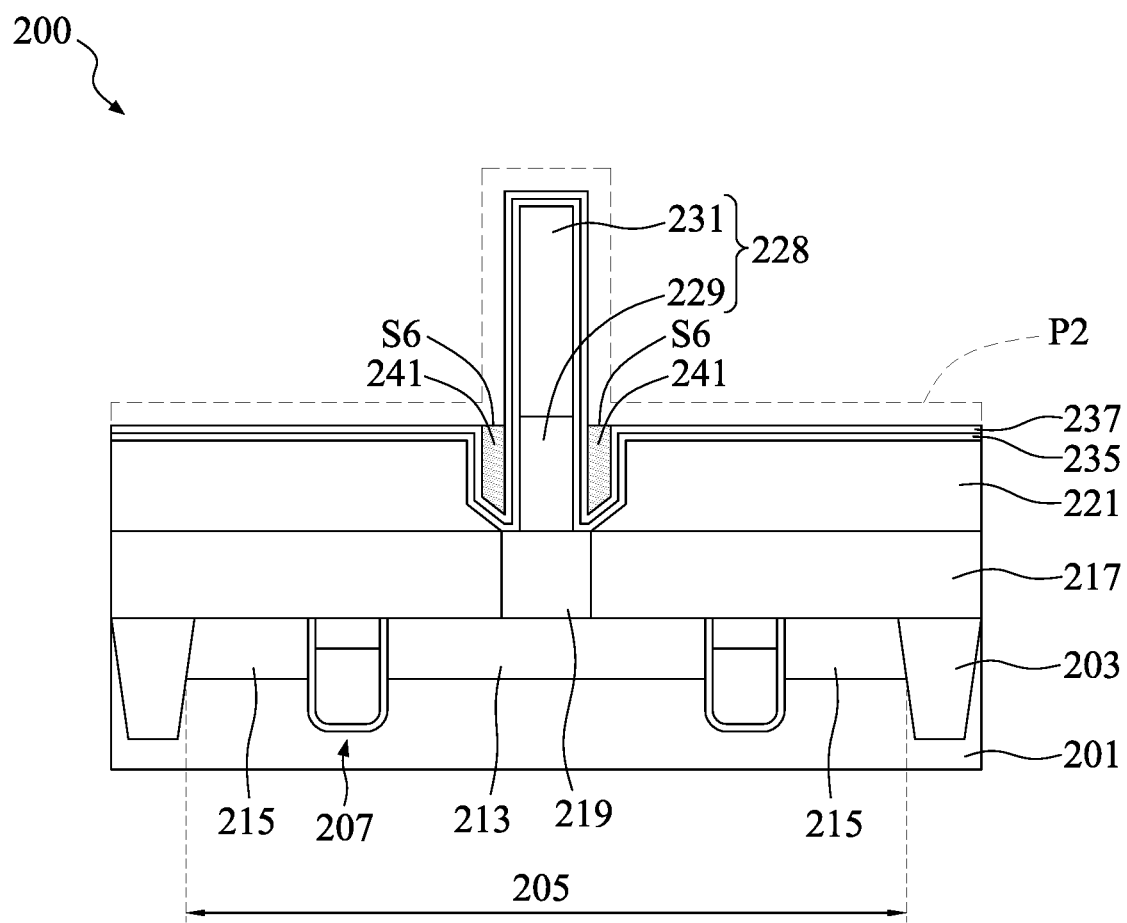

With reference to FIGS. 1 and 19, at step S45, an etching back process is performed to remove a portion P2 of the nitride capping layer 239, thereby forming a refilled contact void 241 between the second insulating layer 221 and the bit line structure 228. The nitride capping layer 239 is completely removed expect for that in the contact void 233. The etching back process is performed to remove the nitride capping layer 239 above the contact void 233. The etching back process is performed to remove the nitride capping layer 239 until the plasma oxide layer 237 is exposed and a refilled contact void 241 is formed. The plasma oxide layer 237 is used as an etch stop layer. In the etching back process, the corner of the nitride capping layer 239 is the slowest position to etch because of the surface area, so the etching time on the bottom of the nitride capping layer 239 has to increase; however, this may result in damaging the nitride capping layer 239 surrounding the bit line structure 228 due to long-term etching and thus forming an undesired undercut (not shown). By performing the nitrogen ion implantation process prior to the etching back process, the density of the surface S5 of the nitride capping layer 239 surrounding the bit line structure 228 can be increased. Thus, a surface S6 of the refilled contact void 241 can be a substantially flat surface, and an undesired undercut is not formed. The etching back process is performed by using a wet etchant comprising phosphorus acid. The etching back process is an isotropic removal process performed with hot phosphoric acid etching in an immersion bath at a temperature of about exceeding about 160° C., such as about 165° C.

Referring to FIG. 19, after performing the nitrogen ion implantation process and the etching back process, the refilled contact void 241 has a flat surface. The refilled contact void 241 does not have an undercut surface. By using the nitrogen ion implantation process to modify the density of the nitride capping layer 239, defects inducing from conventional undesired undercut can be avoided from generating at the subsequent procedure. Moreover, the use of the nitrogen ions as dopants does not affect the electricity and properties of the semiconductor structure. Since defects induced by the undesired undercut can be effectively avoided or reduced, the manufacturing yield may be increased accordingly.

In the manufacturing methods of the semiconductor structure or semiconductor device, a nitrogen ion implantation process is performed to result in a different density profile in the nitride capping layer and increase the density of the nitride capping layer surrounding the conductive line structure. The nitrogen ions are implanted into a portion of the nitride capping layer where an undercut may be occurred, so as to form a substantially flat surface after the etching back process. By using the nitrogen ion implantation process prior to the etching back process, defects induced by undesired undercut can be avoided or reduced, and the manufacturing yield may be increased accordingly. In comparison with conventional the manufacturing process of the present disclosure overcomes avoiding or reducing particle-induced defects. Therefore, the device performance can be enhanced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a semiconductor device, comprising:
    forming a first insulating layer having a bit line contact over a substrate;
    forming a second insulating layer having a bit line opening over the first insulating layer;
    forming a bit line structure in the bit line opening, the bit line structure being electrically connecting to the bit line contact, and a contact void being formed surrounding the bit line structure and partially exposing a surface of the bit line contact;
    conformally forming a nitride spacer layer over the bit line structure, the second insulating layer, and the contact void;
    conformally forming a plasma oxide layer over the nitride spacer layer;
    forming a nitride capping layer over the plasma oxide layer, the nitride capping layer filling the contact void;
    introducing nitrogen ions into a surface of the nitride capping layer surrounding the bit line structure; and
    performing an etching back process to remove a portion of the nitride capping layer, thereby forming a refilled contact void between the second insulating layer and the bit line structure.

2. The method of claim 1, wherein the nitrogen ions are introduced into the surface of the nitride capping layer in a uniform concentration profile.

3. The method of claim 1, wherein the nitrogen ions are introduced into the surface of the nitride capping layer in a non-uniform concentration profile.

4. The method of claim 1, wherein introducing nitrogen ions into the surface of the nitride capping layer is performed by an ion implantation process.

5. The method of claim 1, wherein introducing nitrogen ions into the surface of the nitride capping layer comprises:
    forming a patterned mask layer over the nitride capping layer, the patterned mask layer having a hole corresponding to the contact void;
    doping nitrogen ions into the surface of the nitride capping layer through the hole of the patterned mask layer; and
    removing the patterned mask layer.

6. The method of claim 1, wherein a width of the bit line opening in the second insulating layer is greater than a width of the top surface of the conductive contact.

7. The method of claim 1, wherein a top surface of the bit line contact is fully exposed by the bit line opening.

8. The method of claim 1, wherein forming the bit line structure in the bit line opening of the second insulating layer comprises:
    forming a first conductive material layer on the second insulating layer, the first conductive material layer filling the bit line opening;
    forming a second conductive material layer on the first conductive material layer; and
    performing an etching process to pattern the first conductive material layer and the second conductive material layer, so as to form the bit line structure comprising the patterned conductive material layers.

9. The method of claim 1, wherein the etching back process is performed by using a wet etchant comprising phosphorus acid.

10. The method of claim 1, wherein the etching back process is performed by using the plasma oxide layer as an etch stop layer.

11. The method of claim 1, wherein a top surface of the refilled contact void is a flat surface.

* * * * *